United States Patent
Savas et al.

(10) Patent No.: US 6,706,142 B2
(45) Date of Patent: Mar. 16, 2004

(54) SYSTEMS AND METHODS FOR ENHANCING PLASMA PROCESSING OF A SEMICONDUCTOR SUBSTRATE

(75) Inventors: Stephen E. Savas, Fremont, CA (US); John Zajac, San Jose, CA (US); Mark J. Kushner, Urbana, IL (US); Ronald L. Kinder, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/997,158

(22) Filed: Nov. 28, 2001

(65) Prior Publication Data

US 2002/0096258 A1 Jul. 25, 2002

Related U.S. Application Data

(60) Provisional application No. 60/250,550, filed on Nov. 30, 2000.

(51) Int. Cl.$^7$ .............................. C23C 16/00; C23F 1/00
(52) U.S. Cl. ................. 156/345.48; 118/723 I
(58) Field of Search ................ 118/723 I, 723 IR, 118/723 AN; 156/345.48, 345.49; 204/298.06, 298.34; 315/111.51

(56) References Cited

U.S. PATENT DOCUMENTS 5,522,934 A * 6/1996 Suzuki et al. ......... 118/723 AN
5,811,022 A * 9/1998 Savas et al. .................. 216/68
6,446,572 B1 * 9/2002 Brcka .................. 118/723 ER

* cited by examiner

Primary Examiner—Luz Alejandro-Mulero
(74) Attorney, Agent, or Firm—Wilson Sonsini Goodrich & Rosati

(57) ABSTRACT

Inductively-coupled plasma reactors for anisotropic and isotropic etching of a substrate, as well as chemical vapor deposition of a material onto a substrate. The reactor system comprises a processing chamber with a plasma shaping member contained therein. In one embodiment, the plasma shaping member extends from a portion of the top wall of the processing chamber, downward into the chamber, and it is generally positioned above the center of the substrate. The shaping member may be a separate piece of hardware attached to the top wall of the chamber, or it may be an integral part of the wall itself. Preferably, the plasma shaping member has a recessed portion in the middle and an extended portion located at a distance outside that of the recessed region. The plasma shaping member may be fabricated from virtually any material since it is at an electrically floating potential during processing of the substrate. The plasma shaping member serves to reduce the ion density in the middle of the chamber, above the center of the substrate, thereby enhancing the uniformity of the plasma throughout the chamber. The enhanced plasma uniformity in turn results in more uniform processing rates of a substrate.

22 Claims, 9 Drawing Sheets

SYSTEMS AND METHODS FOR ENHANCING PLASMA PROCESSING OF A SEMICONDUCTOR SUBSTRATE

REFERENCE TO RELATED APPLICATION

The present application claims priority from U.S. provisional application No. 60/250,550 filed Nov. 30, 2000. U.S. provisional application No. 60/250,550 is hereby incorporated herein by reference in its entirety.

BACKGROUND

1. Field of the Invention

Embodiments of the present invention relate to novel systems and methods for processing semiconductor substrates. More specifically, aspects of the present invention relate to systems and methods for enhancing plasma processing of a semiconductor substrate.

2. Description of the Related Art

Plasma-generating reactors have been used extensively in processes for fabricating integrated circuit and microelectromechanical (MEM) devices on or from a substrate such as a silicon wafer. One particularly useful reactor is the inductively-coupled plasma-generating (ICP) reactor, which inductively (and to some extent capacitively) couples radio frequency (RF) power into a gas contained within the reactor to generate a plasma. The plasma contains species such as ions, free radicals, and excited atoms and molecules that may be used to process the substrate and ultimately produce integrated circuit or MEM devices.

An ICP reactor may be used to carry out a variety of processes to fabricate integrated circuit devices on a semiconductor substrate, including anisotropic and isotropic etching and chemical vapor deposition (CVD). For anisotropic etching, an ICP reactor may be used to produce a plasma with a high ion density. Generally, a low pressure and high RF power are used which favor the production of ions. The ions are accelerated perpendicularly toward the surface of the substrate by an electric field which is typically induced by an RF bias applied to the substrate support. The ions bombard the substrate and physically and/or chemically etch the substrate and any materials deposited thereon, such as polysilicon (poly), silica ($SiO_2$, silicon oxide, or oxide), silicon nitride ($Si_3N_4$ or nitride), photoresist (resist), or metals. Such anisotropic etching processes are useful for forming integrated circuit features having substantially vertical sidewalls.

ICP reactors are also useful for producing reactive species for isotropic etching, particularly for stripping photoresist from the surface of a semiconductor substrate. Sufficient energy is coupled into the gas in the plasma generation chamber to form a plasma containing a high density of atomic and molecular free radicals that chemically react with the polymeric photoresist to facilitate its removal. For example, a plasma may be used to dissociate oxygen gas into atomic oxygen that reacts with polymeric photoresist to form CO and $CO_2$, which evolve and are carried away by the process gas into the exhaust system of the reactor. In such processes, in contrast to anisotropic etching, it is often desirable to reduce or eliminate ion bombardment which may damage the surface of the substrate.

ICP reactors are also useful for CVD of a material onto the surface of a substrate. For many CVD processes, the process is enhanced by ion bombardment and may be carried out at lower temperatures with higher deposition rates by exposing the substrate directly to the plasma (this process is called plasma-enhanced or plasma-assisted CVD). In plasma-enhanced chemical vapor deposition (PECVD), sufficient energy is coupled to the gas in the plasma generation chamber to form a plasma containing a high density of atomic and molecular free radicals and energetic species that interact with the surface of the substrate to form a deposited layer. For example, silane ($SiH_4$) releases hydrogen and can be used to deposit a layer of polysilicon onto a substrate. In addition, silane or tetraethoxysilane (TEOS) can be added to an oxygen plasma to deposit a layer of silicon dioxide on a substrate, which in turn can be used as an etch mask during reactive-ion etching or as an insulating layer in circuit devices.

In each of the above processes, processing uniformity can be a critical factor in determining integrated circuit quality, yield, and production rate. Uniform etching, stripping, or chemical deposition over the surface of a wafer assures that structures fabricated at the center of the substrate's surface have essentially the same dimensions as structures fabricated near the edge of the substrate. Thus, the yield of chips from a wafer depends, at least in part, on the etch, strip, or deposition uniformity across the wafer's surface. Higher yield also contributes to a higher production rate.

Processing uniformity may be affected by the density and distribution of reactive species in the plasma and by the plasma potential across the substrate's surface. Processing may occur at higher rates in areas of the wafer surface where there is a higher density of reactive species. Further, for ion enhanced processes, any variance in the plasma potential across the wafer's surface will cause a corresponding variance in ion bombardment energies which may, for example, lead to nonuniform ion etch or ion enhanced deposition.

A number of different inductively-coupled reactor configurations have been used to produce plasmas for the processing of a variety of substrate sizes. In an effort to increase chip production rates, however, integrated circuit manufacturers have moved from small-diameter substrates to substrates of ever-increasing diameters. At one time, 100 millimeter (mm) silicon wafers were the norm. These wafers were subsequently replaced by 150 mm and then 200 mm wafers; most sizes are currently being replaced by 300 mm wafers that will undoubtedly become conventional for high volume and high complexity computer chips in the near future. In time, it is expected that even larger wafers will be developed.

With larger diameter substrates, it becomes difficult to produce a plasma with highly uniform properties in a conventional reactor chamber. For ion enhanced processes, the flux of ions at locations across the wafer surface may become nonuniform. FIG. 1 illustrates a typical cylindrical ICP reactor, generally indicated at 100. In reactor 100, gas is provided to the reactor chamber 102 through an inlet 104. A helical induction coil 106 surrounds the chamber and inductively couples power into the gas in reactor chamber 102 to produce a plasma. Ions or neutral activated species then flow to a wafer surface 108 for processing. In addition, an RF bias may be applied to the wafer to accelerate ions toward the wafer surface for ion enhanced processing.

The dashed line 110 in FIG. 1 represents a maximum potential surface (MPS) for a plasma produced in reactor 100. An MPS is a geometric construction of the maximum values of the DC plasma potential along arbitrary lines drawn from the substrate to points on the interior surfaces of chamber 102. An ion which is created above the MPS senses an electrostatic potential that tends to drive it toward the interior walls of the chamber. An ion created within the MPS senses an electrostatic potential that tends to push it toward the substrate. A higher percentage of ions near the edges of the wafer are driven to the walls than near the center of the wafer as illustrated by the dome-like MPS 110. The difference in the ion flux between the edges and the center of the wafer may be significant and lead to nonuniform processing.

The shape of the MPS may be influenced by the configuration of reaction chamber 102. FIG. 2 illustrates a schematic diagram showing the plasma properties in a reactor that contains a conically-shaped section 202 above a vertical-walled section 204 of a reactor generally indicated at 200. The dashed line 210 in FIG. 2 represents the MPS for a plasma produced in reactor 200. Also shown in FIG. 2 is an induction coil 220 positioned along conically-shaped section 202 of the reactor. This configuration produces regions of "hot electrons" generally indicated at 225 in the chamber, with the hot electrons producing a particularly high rate of ionization of the processing gas in these regions of the chamber. The high rate of ionization helps to counteract the natural tendency of the MPS to drop off near the sidewalls of the reactor. The result is the development of a flatter MPS in the chamber than would have been attained in a reactor having no conical section, and a more uniform ion density above the substrate is achieved as well. In addition, the truncated conical arrangement of the coil allows the top of the chamber 230 to be lowered (moved toward the substrate) which helps flatten out any peak in the stagnation surface over the center of the wafer.

A conical reactor, such as reactor 200, provides advantages over a reactor with vertical sidewalls such as reactor 100. The MPS in a conical reactor has less curvature (i.e., less of a dome-shape) than would have been the case in a reactor without conical walls. However, it is desirable to flatten the MPS even further, and to provide plasma processing properties that are enhanced to an even greater extent.

What is needed is a plasma reactor with enhanced control over the plasma characteristics while allowing large diameter wafers to be processed. Preferably such a plasma reactor can be used to provide a uniform plasma potential and/or species concentration across the surface of a substrate for etching, stripping or chemical vapor deposition and can be used to process smaller substrates such as 100 mm, 150 mm, and 200 mm wafers as well as 300 mm or larger wafers. In addition, for non-ion enhanced processes, such as photoresist strip, it is desirable to provide a reactor configuration that both enhances the uniform production of reactive species and provides a plasma generation volume that can be used to isolate the plasma from the wafer surface to reduce ion drive-in.

SUMMARY OF THE INVENTION

Aspects of the present invention achieve enhanced plasma uniformities by providing a plasma shaping member within the reaction chamber of an ICP reactor. In an exemplary embodiment, the plasma shaping member extends from the bottom surface of a portion of the top wall of reaction chamber. Preferably, the plasma shaping member is generally centered above the substrate support. The plasma shaping member may be a separate piece of hardware attached to a portion of the bottom surface of the top wall of the chamber, or it may comprise an integral part of the top wall itself. The plasma shaping member may also be configured to have a recessed or concave central region and an extended portion peripheral to the central region. Both the extended and recessed segments of this exemplary embodiment face the substrate. The term "extended" as used in this exemplary embodiment is meant to indicate that a portion of the plasma shaping member protrudes from a region of the top wall of the chamber into the volume of the chamber body to a greater degree than does the recessed region.

In another exemplary embodiment, the exemplary plasma shaping member has dimensions X, Y, Z, and R that are relevant to the design and performance of the member. The exemplary plasma shaping member may be thought of as a two-part structure comprising a toroidal-like form adjacent to a substantially cylindrical structure having a similar outside diameter as the toroid-like form. The recessed portion of the exemplary plasma shaping member is that portion of the substantially cylindrical structure that would lie within the toroid in a projected (plan) view. The recessed region of the plasma shaping member has thickness X (which may be approximately the same dimension as the height of the cylindrical structure of the member). The extended portion of the exemplary plasma shaping member (the toroidal-like form) has a width Z and height Y. The dimension R indicates the outside radius of the member. However, the extended portion is not required to be the outermost annulus of the member, nor does it have to be rectangular or square in cross section.

In another exemplary embodiment, the width of the extended portion of the plasma shaping member (Z) has a value greater than or equal to about 10 percent of the outside diameter of the member (2R), and a value less than or equal to about 30 percent of the outside diameter of the member. The minimum value of X plus Y, the sum of which is the distance the member protrudes into the chamber, may be about 10 percent of the height of the chamber ($H_{chamber}$). In one embodiment of a reactor with a plasma shaping member, the distance from the top of the substrate support to the bottom of the plasma shaping member, which algebraically would be H−(X+Y), is four inches or less. The outside diameter of the plasma shaping member may range from about 60 to about 90 percent of the diameter of the substrate ($D_{substrate}$).

The plasma shaping member may be fabricated from essentially any type of material, including quartz, metals, ceramics, and coated metals, and combinations thereof. The material may be selected taking into account considerations such as cost, machinability, and potential for contamination. The material should also be selected, and the plasma shaping member should be configured, to provide an electrically floating potential relative to ground while processing the substrate. Providing an electrically floating potential during processing is one of the mechanisms by which the member removes ions from the chamber and serves to shape the plasma. Positive ions that hit the surface of the shaping member recombine with an electron (or possibly negative ion) to form a neutrally charged species. The recessed section and the extended section of the exemplary plasma shaping member both function to provide a surface upon which positive ions may become converted to electrically neutralized particles.

The exemplary plasma shaping member may further reduce the ion density of a plasma by a second mechanism. The extended section physically blocks the diffusion of high temperature electrons from regions adjacent to coil (where the high temperature electrons are generated) to the center regions of the chamber that overlie the center of the substrate. If these electrons are free to diffuse to the center of the chamber, they may cause additional ionization of the process gas beneath the recessed region of the member overlying the center of the substrate. Because the extended section of the exemplary plasma shaping member provides an obstacle to the diffusion of high temperature electrons from the edge of the chamber to the center of the chamber, it will be appreciated by one skilled in the art that virtually any shape of protrusion will suffice.

As a result, a reactor according to exemplary embodiments of the present invention produces a plasma with a more uniform potential and ion concentration across both the center and periphery of the substrate surface. For example, it is believed that exemplary embodiments utilizing the principles of the present invention can achieve a plasma uniformity that is better (less than) ±15 percent. As a result, an RF bias applied to wafer support accelerates ions toward the wafer surface for etching or plasma-enhanced CVD with a substantially uniform energy and density distribution. This provides a consistent processing rate (whether for etch or deposition) across the surface of the substrate.

BRIEF DESCRIPTION OF THE DRAWINGS

These and other features and advantages of the present invention will become more apparent to those skilled in the art from the following detailed description in conjunction with the appended drawings in which.

DESCRIPTION

Figure 1:
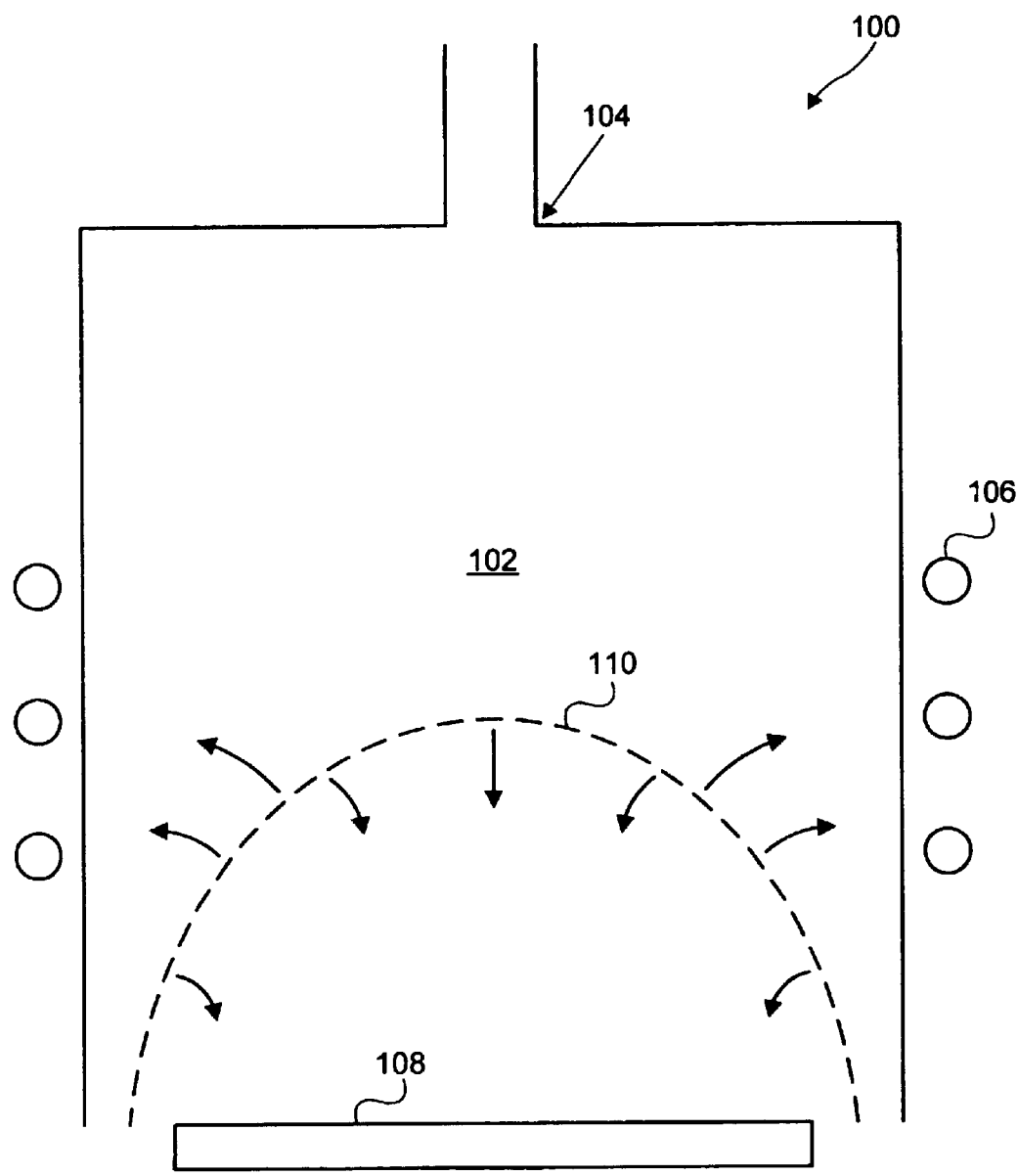
FIG. 1 illustrates a simplified diagram showing the dome-shaped maximum potential surface (MPS) of the plasma in a conventional cylindrical ICP reactor.

Aspects of the present invention provide novel systems and methods for processing semiconductor substrates. The following description is presented to enable a person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, and should be accorded the widest scope consistent with the principles and features disclosed herein.

Before describing the details of an exemplary plasma shaping member, it will be helpful to address some general principles regarding the distribution of the plasma density in a reaction chamber. Plasma density may be considered equivalent to positive ion density, and depends upon the configuration of the chamber in which the plasma is being formed. A first parameter that influences the ion density just above the wafer, and the distribution of the ion density within the plasma generation chamber, is the height of the chamber ($H_{chamber}$) relative to its diameter ($D_{chamber}$). Here, $H_{chamber}$ is defined as the distance from the top surface of the substrate support to the bottom (or inside) surface of the top wall of the chamber. In a conventional reactor at low pressures (<50 mTorr), the ion density has a tendency to be greatest in the center of the chamber. In a conventional reactor where H/D is relatively small, the portion of the plasma with the highest density overlies the center regions of the substrate. This is undesirable in many circumstances because it leads to a faster processing rate in the center of the substrate than at the edge of the substrate.

One technique for overcoming an excessively high plasma density in the center of the chamber is simply to increase the chamber's diameter relative to its height and to the wafer size. This has the effect of increasing the volume of the chamber that resides between the edge of the substrate and the chamber sidewalls, and ultimately the plasma is re-shaped so that its density in the center of the chamber is reduced relative to that above the wafer edge. If the height is reduced sufficiently so that it is less than or about 0.6 of the diameter, the plasma density is "reduced" in the center and "not reduced" at its sides so that the equipotential takes on a shape approaching a toroid. In this case, the regions of highest plasma density are now located in a donut-like shape, concentrated in a space more towards the sidewalls than the center of the chamber. In effect, the ion density is pushed out to the sides of the reaction chamber since a greater volume of space around the edge of the substrate has been provided into which the plasma may expand. Typical plasma density uniformities across a wafer surface may be in the range of ±20% or greater for a reactor with a large height/diameter ratio where the wafer is almost as large in diameter as the chamber ($R_{chamber} > R_{wafer} > 0.85\ R_{chamber}$). Plasma density uniformities may be improved by the "brute force" approach of simply increasing the chamber's diameter while keeping the height of the reactor constant.

The disadvantage of simply increasing the diameter of a chamber relative to its height (and the wafer) is that a larger chamber occupies a bigger footprint on the floor space of a fabrication cleanroom. This will negatively impact such properties as throughput per square meter of floor space. In other words, the throughput per square meter of a small tool is greater than the throughput of a large tool if both tools are processing the same number of substrates per unit time. Higher values of this performance parameter indicate that more efficient use of the expensive factory floor space is being accomplished.

Throughput per square meter of floor space may be characterized by units of wafers per hour per meter squared of floor space (wafers/hr-m$^2$). The Semiconductor Equipment and Materials International (SEMI) organization has recommended that this stay constant even while the industry transitions from 200 to 300 mm substrates, with larger substrates likely to follow. A tool processing 300 mm substrates must necessarily be larger than one processing 200 mm substrates, so the increase in the footprint of the chamber must be compensated for in some other manner.

It is apparent that the demands on the tool to maintain constant throughput per unit floor space while processing larger substrates are difficult to satisfy. Thus, systems and methods that are capable of improving plasma density uniformity for a given size substrate, without resorting to larger chambers, are highly desirable.

While $D_{chamber}/H_{chamber}$ is important for determining plasma properties, there is another useful parameter for describing the compactness metric for the space efficiency of a tool. This compactness metric is found by taking the ratio of the internal area of the processing chamber, in a plane parallel to the substrate, to the area of the substrate itself. A typical value in the industry for this parameter $A_{chamber}/A_{substrate}$ is about 4, which would be the case for a reaction chamber having a 14 inch internal diameter (and 16 inch outside diameter), processing an 8 inch diameter substrate. These dimensions are representative of a tool in the so-called "high-density plasma" category of semiconductor processing tools.

Exemplary embodiments of the present invention may attain plasma uniformities below about ±15% without having to resort to a larger chamber for a given size substrate. The $A_{chamber}/A_{substrate}$ ratio for exemplary embodiments of the present invention may range from about 2 to about 4. In one embodiment designed to process 8 inch wafers, wherein the processing chamber has an internal diameter of about 9.25 inches (and an outside diameter of about 11 inches), the $A_{chamber}/A_{substrate}$ ratio is about 2. In other exemplary embodiments of the present reactor system, the $A_{chamber}/A_{substrate}$ ratio has a value of 2.6 or less. Conventional reactors typically allocate a distance of about 3 to 4 inches between the edge of the substrate and the chamber sidewall, whereas this distance may be reduced to about 1 inch in exemplary embodiments of the present invention.

Figure 3:
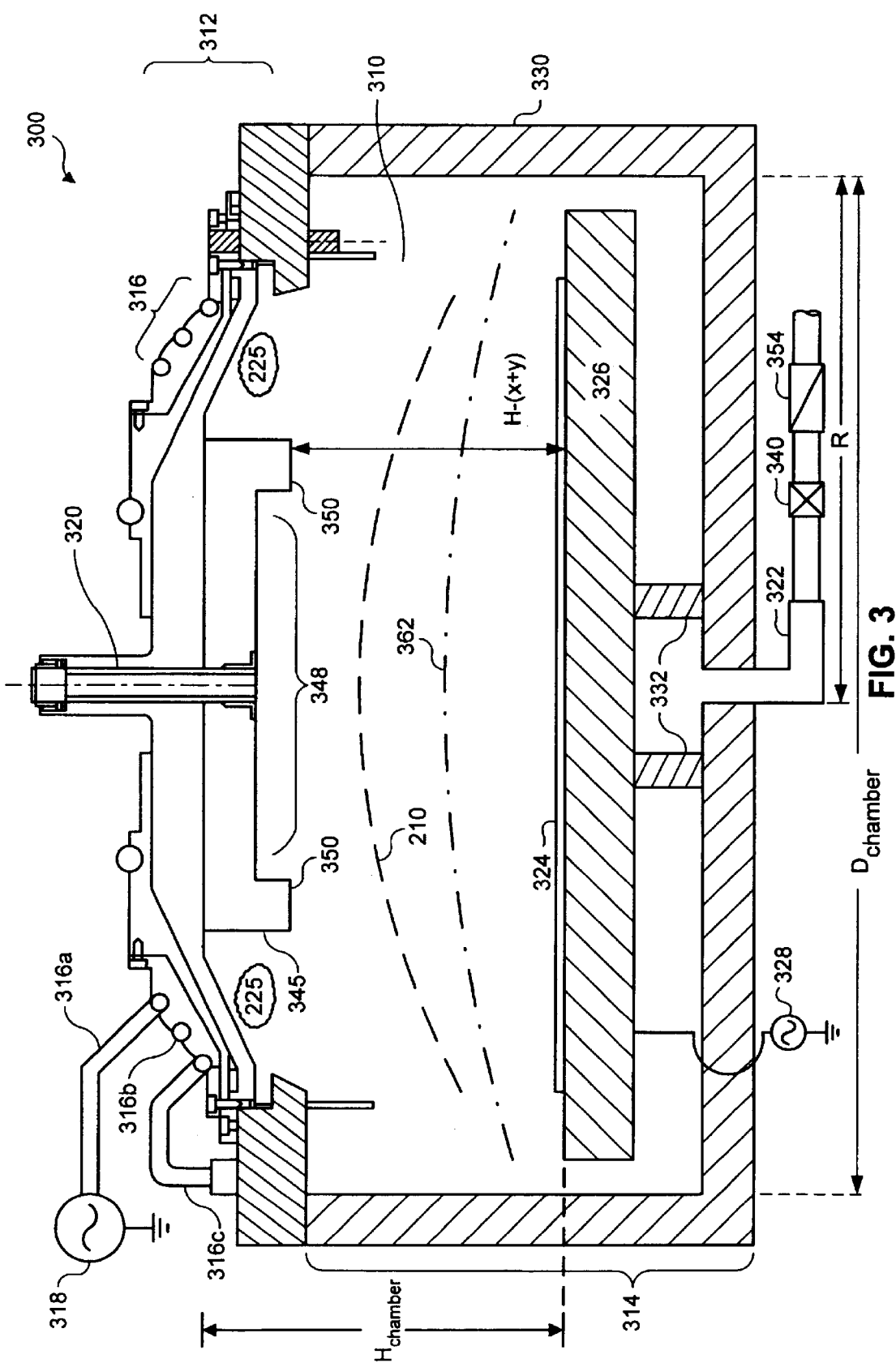
FIG. 3 shows a cross-sectional view of a plasma reactor system according to an exemplary embodiment of the present invention.

Exemplary systems and methods for further shaping of the plasma will now be described. FIG. 3 illustrates a side cross section of an inductively coupled plasma reactor system according to exemplary embodiments of the present invention for ion enhanced processes such as anisotropic etch, photoresist strip, and plasma enhanced CVD. Referring to FIG. 3, the reactor system generally indicated at 300 has a processing chamber 310 with a conically-shaped section 312 and a substrate processing section 314. U.S. Pat. No. 5,964,949 provides additional description of a plasma reactor having a conically-shaped plasma-generation section and is hereby incorporated by reference. A helical induction coil 316 surrounds a part of the conically-shaped section 312 and substantially conforms to its shape. The induction coil 316 is coupled to a first source of radio frequency power 318 to inductively couple power into plasma generation chamber 310.

Gas is provided to the processing chamber 310 through a gas inlet 320 and is exhausted from the reactor through a gas outlet 322. The inductively coupled power from induction coil 316 causes a plasma to form in chamber 310. A substrate to be processed, such as a semiconductor wafer 324, is placed on a support 326 below the plasma. The inductively coupled power creates an electric field which is circumferential within the plasma and generally does not accelerate charged particles toward wafer 324. The level of power applied to the induction coil may be adjusted to control the ion density in the plasma. Some power from the induction coil may be capacitively coupled into the plasma, however, and may accelerate ions toward the walls and the wafer. To reduce this capacitive coupling a split Faraday shield (not shown) may be placed around the reactor. For more details, see U.S. Pat. Nos. 5,534,231 and 5,811,022, which are hereby incorporated herein by reference.

A second source of radio frequency power 328 may be applied to substrate support 326 to controllably accelerate ions toward wafer 324 for processing. A relatively high level of power may be applied to induction coil 316 to provide a plasma with a high ion density, and a relatively low level of power may be applied to substrate support 326 to control the energy of ions bombarding the wafer surface. As a result, a relatively high rate of etching may be achieved with relatively low energy ion bombardment. The use of low energy ion bombardment may be desirable in some processes to protect sensitive integrated circuit layers from damage.

The conically-shaped chamber section 312 and induction coil 316 of this embodiment allow a plasma to be formed above the surface of wafer 324 with a certain uniformity of the plasma and species concentration. The induction coil spirals around the conically-shaped chamber section 312 substantially conforming to its shape. In this embodiment, coil 316 completes three turns 316a–c along conically-shaped section 312 of processing chamber 310.

For processing a roughly twelve inch (300 mm) wafer, the first turn 316a may have a diameter from the center of the coil on one side of the chamber to the center of the coil on the other side of the chamber in the range of from about nine to twelve inches. The second turn 316b may have a diameter in the range of from about ten to fourteen inches; and the third turn 316c may have a diameter in the range of from about twelve to sixteen inches. In a conventional cylindrical reactor, on the other hand, each turn of the coil would typically have the same diameter.

Exemplary embodiments of the present invention achieve enhanced plasma uniformities by providing a plasma shaping member within reaction chamber 310. The exemplary reactor of FIG. 3 includes plasma shaping member 345. Plasma shaping member 345 extends from the bottom surface of a portion of the top wall of reactor 300, downward into the chamber and toward substrate support 326. Preferably, plasma shaping member 345 is generally centered above substrate support 326. The plasma shaping member 345 may be a separate piece of hardware attached to the top wall of the chamber, or it may comprise an integral part of the wall itself. In the exemplary embodiment of FIG. 3, the plasma shaping member 345 has a recessed (or concave) portion 348 in the center of the member 345 and an extended portion represented by reference numeral 350. Both extended and recessed segments of the exemplary plasma shaping member 345 face the substrate. The term "extended" as used in the exemplary embodiment of FIG. 3 is meant to indicate that a portion 350 of the plasma shaping member 345 extends from a region of the top wall of chamber 310 into the volume of the chamber body to a greater degree than the recessed portion 348 does.

Figure 4A:
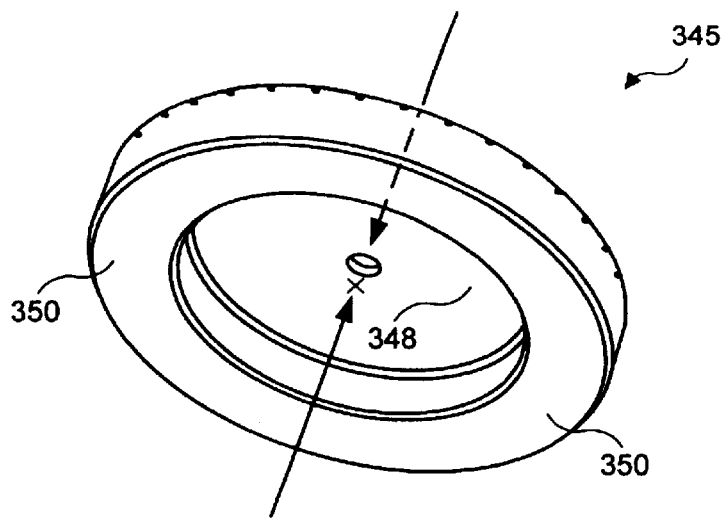
FIG. 4A illustrates a 3-D view of an exemplary plasma shaping member according to exemplary embodiments of the present invention.
Figure 4B:
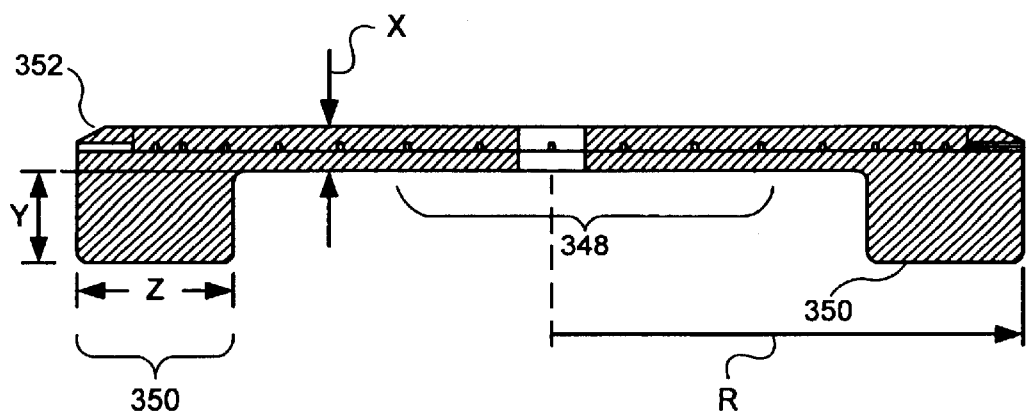
FIG. 4B shows a side cross-sectional view of the exemplary plasma shaping member of FIG. 4A.

The exemplary plasma shaping member 345 of FIG. 3 is shown in a three-dimensional view in FIG. 4A, with the dimensions X, Y, Z, and R that are relevant to the design and performance of member 345 labeled in the cross sectional view depicted in FIG. 4B. The plasma shaping member 345 may be thought of as a two-part structure comprising a toroidal-like form adjacent to a substantially cylindrical structure having a similar outside diameter as the toroid. The recessed portion 348 of shaping member 345 is that portion of the substantially cylindrical structure that would lie within, substantially within, or having a part lying within the toroid in a projected (plan) view. In FIG. 4B, the concave or recessed portion 348 of the member 345 is shown as having a thickness X, and the extended portion 350 is shown as having a width Z and height Y.

It should be emphasized that the extended portion 350 does not have to be an outer-most annulus of the member 345, nor does the extended portion 350 have to be rectangular in cross section. Rather, persons of ordinary skill in the art will recognize that the extended portion 350 could be a middle annulus of member 345 such that the outside diameter is a portion of recessed portion 348, or a segment having a different distance from substrate support 326 and extending to a radius beyond that of extended portion 350. In an alternative embodiment, a structure analogous to that of FIG. 4B comprises a section of a sphere (or ellipsoid, or other smoothly rounded or segmented structure) which has a radius of curvature, or average radius of curvature, less than the wafer radius. In this embodiment, the height of the structure above the middle of the wafer is slightly greater than that of FIG. 4B, and the height above the substrate support at a radius R would be slightly less than that of FIG. 4B. In this embodiment, the plasma absorption of the structure might be comparable to that of the generally rectangular structure shown in FIGS. 4A and 4B. Preferably, the structure is configured to be closer to substrate support 326 at a radius R which is less than the radius of the wafer (between 60% and 90%) than at the center, such that plasma is absorbed by the member 345 thereby producing a uniform ion current density at the wafer surface. Likewise, persons of ordinary skill in the art will recognize that the plasma shaping member 345 does not have to be circular in a plan view, and other shapes, such as a square member with or without rounded corners, may be used in alternate embodiments.

In one exemplary embodiment, the width of the extended portion, Z, has a value greater than or equal to about 7 percent of the outside diameter of the member (2R), and a value less than or equal to about the outside diameter of the member 345. In another exemplary embodiment, Z has a value of about one quarter of the outside diameter of the plasma shaping member 345. When processing 200 mm substrates, the values of X and Y may be between about 0.3 and 0.5 inches, so that the total distance (X+Y) that the member extends downward from top wall of chamber 310 is about one inch or a little less. This of course depends upon the size, shape, height, and width of the plasma processing chamber, as well as the slope of the conically-shaped section 312 of the reactor (if there is a conical section). The minimum value of X plus Y (the sum of which is the distance member 345 protrudes into chamber 310), may be about 10 percent of the height $H_{chamber}$ up to about 30 percent, depending on the shape of the structure. In one embodiment of a reactor with a plasma shaping member, the distance from the top of the substrate support 326 to the extended portion 350 of plasma shaping member 345, which algebraically would be H−(X+Y), is less than four inches.

In other exemplary embodiments, the outside diameter of the plasma shaping member 345 (equal to two times the dimension "R" in FIG. 4B) may be roughly three quarters of the diameter of substrate 324. For example, the outside diameter of the plasma shaping member may range from about 60 to about 90 percent of the diameter of the substrate. It should be noted that the optimal ratio of the outside diameter of plasma shaping member 345 to the diameter of substrate 324 depends on $H_{chamber}$ as well. Accordingly, the plasma shaping member may have a larger value of X plus Y in the event a reactor with a larger chamber height is used.

It should be noted that the design of the plasma shaping member may also be influenced by the size, shape, orientation, and configuration of the walls of the reactor. For example, it may be advantageous to configure a plasma shaping member with a larger overall size when used in a conical reactor with steeper slopes on the conical section and a greater height of plasma generating volume. In an exemplary embodiment, plasma shaping member 345 has a diameter that is slightly larger than the center, horizontal section of processing chamber 310. In this case, plasma shaping member 345 may have a beveled edge 352 (shown in FIG. 4B) to accommodate conically-shaped section 312 of reactor 300.

The design of plasma shaping member 345 may also be optimized by empirical methods, but these are often times consuming and costly to carry out. Computer simulations offer an alternative. For example, computer simulations that predict plasma density uniformity in terms of the shaping member's design parameters X, Y, Z, and R in a reactor processing 200 mm substrates have been conducted to determine the optimum value of the outer radius of the member, R, and as a function of the width of the extended section, Z.

Figure 5:
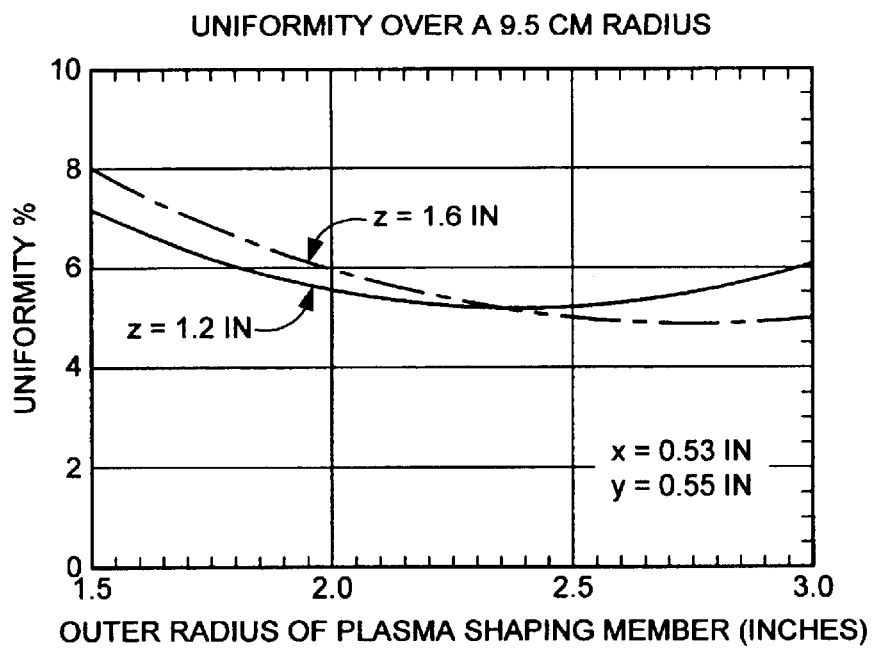
FIG. 5 illustrates a graph of plasma uniformity as a function of the outer radius of an exemplary plasma shaping member.

The results of a simulation varying R are shown in FIG. 5. The plasma density uniformity over a 9.5 cm radius was modeled for two values of Z (1.2 and 1.6 inches) of the plasma shaping member 345 with a fixed X dimension of 0.53 inches, and a fixed Y dimension of 0.55 inches. In this exemplary simulation in which 200 mm substrates were being processed, a minimum in uniformity was found at an R value of about 2.3 to 2.5 inches for two extended section widths (Z values) 1.2 and 1.6 inches, respectively.

Figure 6:
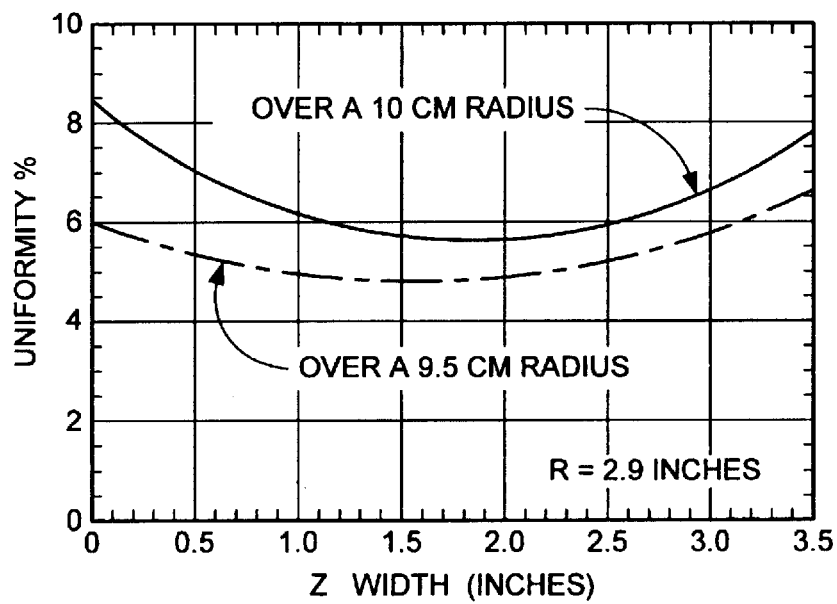
FIG. 6 illustrates a graph of plasma uniformity as a function of the Z dimension of an exemplary plasma shaping member.

The results of a simulation varying Z are shown in FIG. 6. The uniformity over a 9.5 and 10 cm radius of reaction chamber space was also found to have a minimum as the width of the extended section 350 was varied. As the width was varied from 0 to 3.5 inches, for example, the uniformity was seen to have a minimum value of about 5 to 6% for a member having a fixed radius R of 2.9 inches, X thickness of 0.53 inches, and Y height of 0.55 inches. Again, this simulation was conducted for 200 mm substrates.

Figure 7:
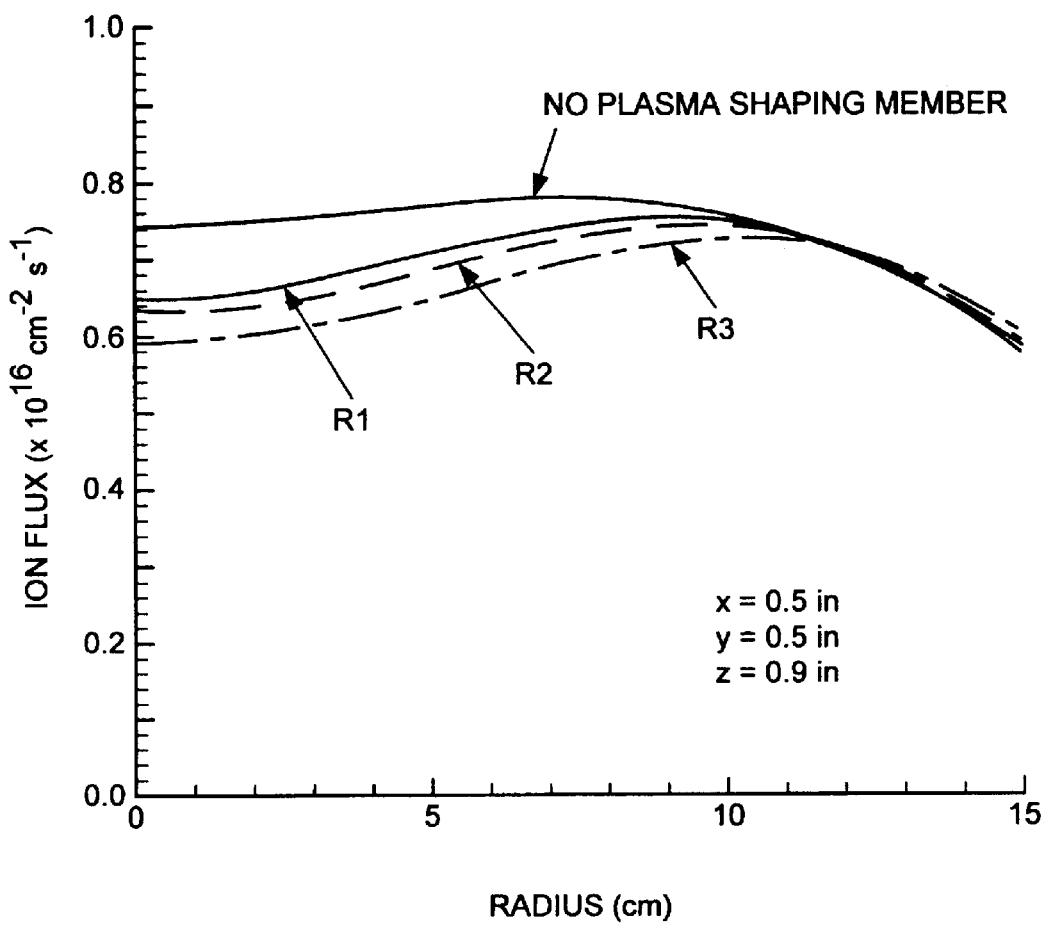
FIG. 7 is a plot of ion flux to a substrate as a function of the radius of a plasma chamber having no shaping member and having three different shaping members of varying radii.

These simulations are presented to demonstrate that varying the size and structure of a shaping member will influence plasma density uniformity. Another way to consider plasma density uniformity is to measure (or simulate) the positive ion flux to the substrate, wherein ion flux has units of numbers of ions traveling through a unit area parallel to the substrate per unit time, and wherein ion flux is physically the positively charged ion current to the substrate integrated over time. An exemplary ion flux to a 300 mm substrate, as a function of distance from the center of the substrate, is shown in FIG. 7. Simulated data in FIG. 7 has been generated for three different plasma shaping members with varying outer radii, but with constant X and Y values of 0.5 inches each, and a constant Z value of 0.9 inches. The first member had an outer radius $R_1$ of 5.73 cm; the second member had an outer radius $R_2$ of 7.14 cm; and the third member had an outer radius $R_3$ of 8.61 cm. Also plotted in FIG. 7 is the ion flux as a function of distance from the center of the substrate for a reactor having no plasma shaping member.

It may also be seen in FIG. 7 that the plasma density has a peak at a radius (for each of the three sizes of shaping members) at about sixty percent to two thirds of the diameter of the wafer; in other words, the maximum ion current density lies within the projected area of the wafer. It may also be seen from FIG. 7 that the larger the outer radius of the shaping member, the greater the suppression of the ion flux to the center of the wafer. This is partly a surface area effect (the surface area of the shaping member), and its mechanism will be addressed in a discussion to follow.

Figure 8:
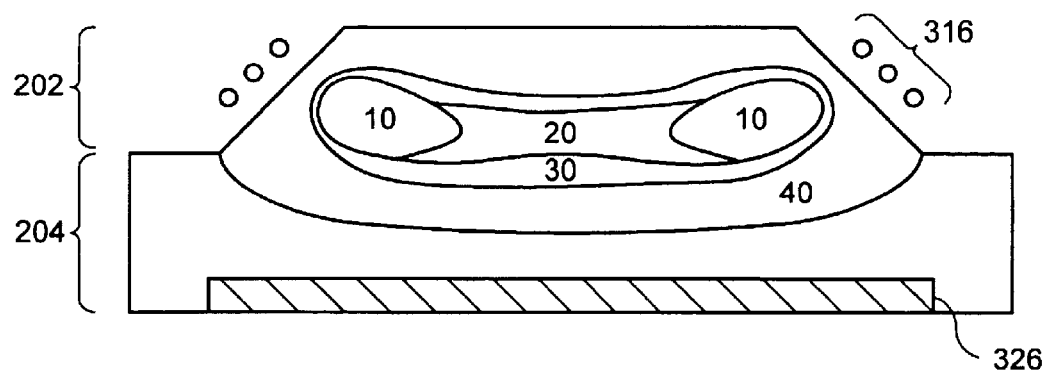
FIG. 8 illustrates an exemplary view of the ion density distribution within a plasma reactor having no shaping member.
Figure 9:
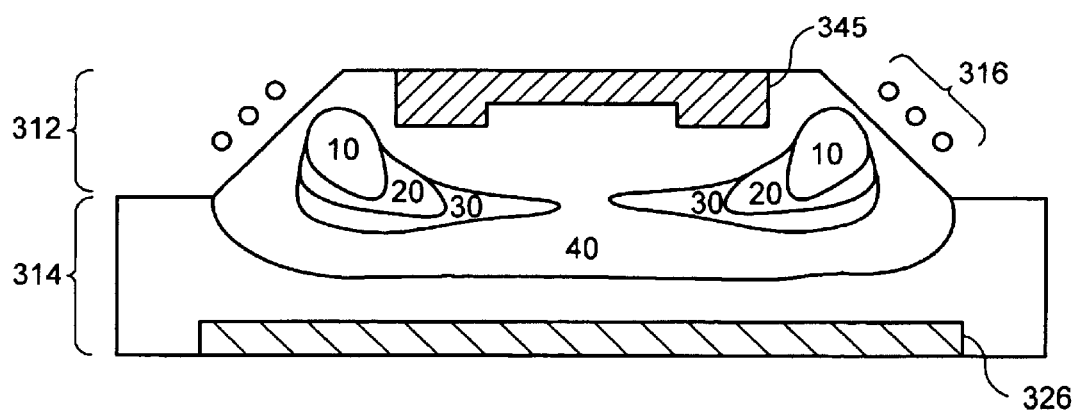
FIG. 9 illustrates a pictorial view of the ion density distribution in a plasma reactor having an exemplary shaping member.

A pictorial display of plasma density in an exemplary reactor with and without a shaping member is shown in FIGS. 8 and 9, respectively. In FIG. 8, reference numeral 10 delineates a region of the plasma containing the highest density of ions, which in an actual reactor might be in the general realm of about $1 \times 10^{12}$ ions per $cm^3$. Reference numerals 20 and 30 might illustrate, for example, ion densities of $0.5 \times 10^{12}$ and $1 \times 10^{11}$ ions per $cm^3$, respectively. Reference numeral 40 indicates a region of the plasma having the lowest ion density of about $1 \times 10^{10}$ ions per $cm^3$. Referring to FIG. 9, it will be noted that the effect of the plasma shaping member 345, in this exemplary reactor, is to reduce the density of ions in the central region of the chamber by a factor of about 2. It will be appreciated that plasma shaping member 345 is reducing the flux of ions to the center of the substrate relative to the value that would have been manifested had the plasma shaping member been absent from the chamber. Since the plasma shaping member serves to slow down processing rates at the center of the substrate relative to the edge, and since processing rates were too high at the center without the shaping member, the overall effect of plasma shaping member 345 is to improve processing rate uniformities over the entire substrate.

The plasma shaping member 345 may be fabricated from essentially any type of material, including quartz, metal, or ceramic, and combinations thereof. The material may be selected taking into account considerations such as cost, machinability, and potential for contamination. The material should also be selected, and the plasma shaping member should be configured, to provide electrical potential that is grounded or "floating" relative to ground during processing. The physics of a plasma discharge dictates that an insulating surface positioned within the reaction chamber during processing will receive an equal flux of positive ions and negatively charged species, the latter comprising electrons and negative ions as well. During processing, the insulating surface charges up to an electrical potential called a "floating potential" at which the surface receives an equal flux of positively and negatively charged particles. Virtually every positive ion that hits the surface recombines with an electron to form neutral species, which may be in the form of a neutral radical, an atom, or a molecule. The recessed portion 348 and the extended portion 350 both function to provide a surface upon which positive ions may become converted to electrically neutralized particles.

Referring again to FIG. 3, the plasma shaping member 345 may reduce the ion current density of the plasma by a second mechanism, one in which the extended portion 350 plays a major role. The extended portion 350 of the member 345 may physically block the diffusion of high energy electrons 225 from regions adjacent to coil 316, where they are generated, to center regions of the chamber that overlie the center of substrate 324. If these electrons were free to diffuse, they would cause additional ionization beneath the recessed portion 348 of the member.

Because the extended portion 350 is providing an obstacle to the diffusion of high energy electrons from the sides of chamber 310 to the center of the chamber, it will be appreciated by one skilled in the art that virtually any shape of the extended portion 350 will suffice. In the exemplary plasma shaping member 345 of FIGS. 3 and 4, this extended portion 350 has been shown with a substantially rectangular cross-section, but the extended section could take on a variety of shapes (circular, triangular, saw-tooth, etc.) and still accomplish its function of providing an obstacle. Although the absorption of ions occurs over the entire surface of the plasma shaping member 345, recessed portion 348 as well as extended portion 350, the extended portion 350 plays a major role in blocking high temperature electrons from diffusing to the center of the chamber.

Thus, there are at least two mechanisms by which plasma shaping member 345 functions to enhance plasma processing, each of which has its own influence on the design of the member with regard to size and shape. As a result, the reactor according to an embodiment produces a plasma with a uniform potential and ion concentration across both the center and periphery of the wafer surface. An RF bias 328 applied to wafer support 326 therefore accelerates ions toward the wafer surface for etching or plasma enhanced CVD with substantially uniform energy and density. This results in consistent processing (whether for an etch or deposition) across the surface of substrate 324.

Having discussed the design of a plasma shaping member and its effect on the plasma, the concept of the maximum potential surface 110 (first introduced in FIG. 1) may be revisited. The curvature of the maximum potential surface (MPS) is indicative of the uniformity of the plasma. Without a plasma shaping member 345, a reactor with vertical sidewalls displays an MPS with a dome-like appearance. If the diameter of the chamber is decreased (such as, for example, by moving the sidewalls of the chamber inward, toward the center of the chamber), the curvature of the MPS is increased even further and the surface becomes even more "bubble-like," indicating that the plasma has become more non-uniform. The non-uniformity associated with the highly domed MPS arises from the fact that there is more ionization between that surface and the substrate support above the center of the substrate than at the edge of the substrate. This is due to the significantly larger volume between substrate and maximum potential surface above the substrate center than thee edge, and the ionization rates are not sufficiently different to compensate for it.

Figure 2:
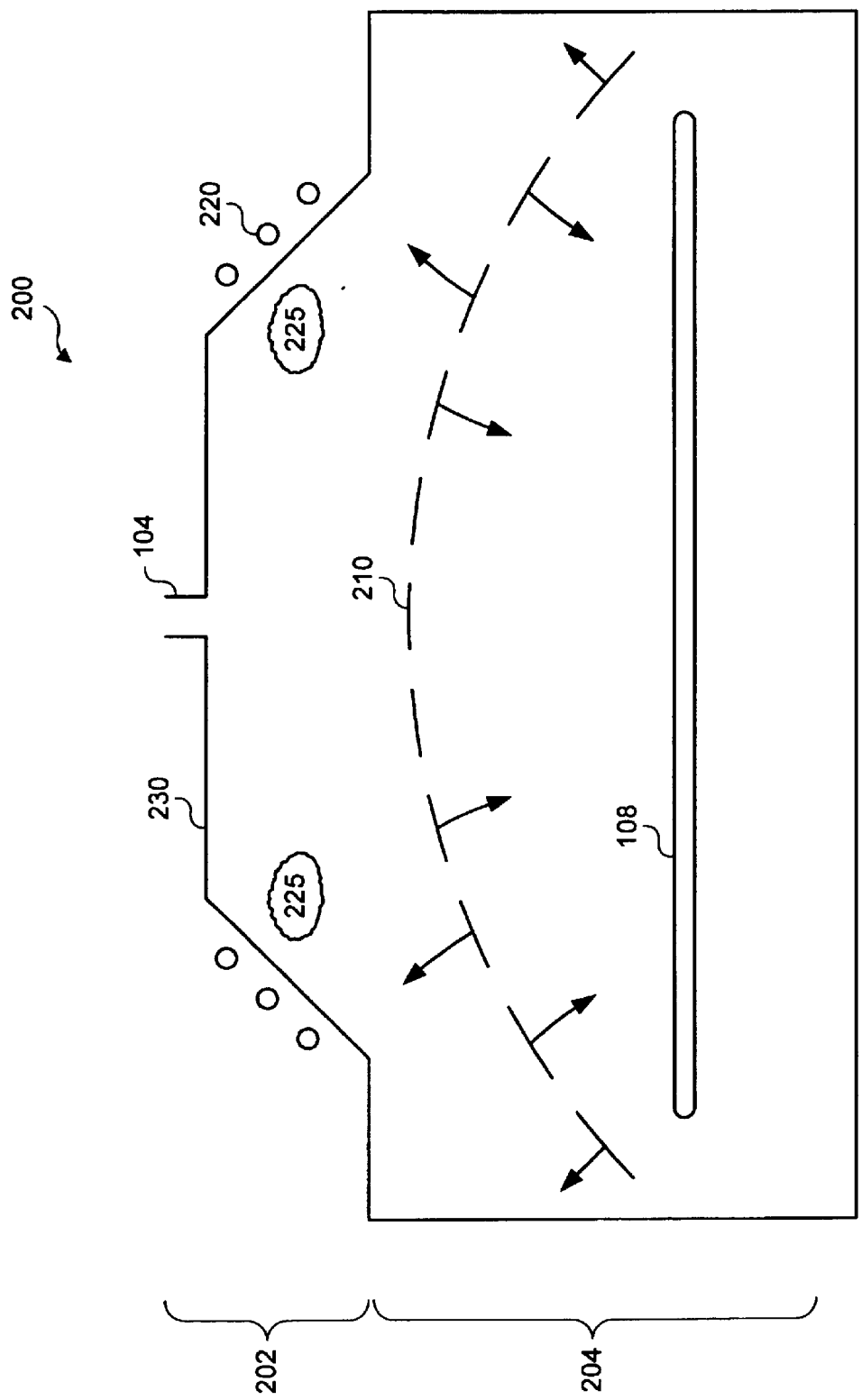
FIG. 2 depicts a simplified diagram showing the MPS of the plasma in an ICP reactor having a conical section as well as a section with vertical sidewalls; the MPS of FIG. 2 has less curvature than the MPS of FIG. 1.

The inclusion of a conically shaped section in a plasma reactor decreases the curvature of the stagnation surface relative to what it would have been in a reactor having no plasma shaping member. MPS 210 of FIG. 2 illustrates the status of the maximum potential surface which would exist if plasma shaping member 345 were not present in the chamber. Referring again to FIG. 3, providing plasma shaping member 345 in reaction chamber 310 pushes the stagnation surface down to position 362 as depicted in FIG. 3. MPS 362 is substantially flatter than 210, and provides a more nearly equal number of ions being driven to the substrate 324 at its center as at its edges. Thus, processing rates will be more nearly equal at different locations on the substrate.

Embodiments of the plasma shaping member of the present invention offer benefits in addition to enhanced plasma uniformity. Some of the advantages of a compact chamber design have already been discussed. Compact chamber designs, made possible through the use of embodiments such as plasma shaping member 345, restrict the plasma to a smaller volume, and allow the reactor to be built with less clearance between the edge of the substrate and the chamber sidewall. Reactive species generated in this volume of the chamber (at radii greater than the radius of the substrate) are therefore less in amount in these compact designs than in larger chambers. Hence, reaction processes due to neutral species on the substrate surface near the edge are decreased, becoming more equal to rates in the interior of the substrate, and leading to more uniform processing.

The construction of a smaller processing chamber also has the advantage of enabling the transport chamber adjacent to the processing chamber to be made smaller as well. This transport chamber functions as an internal staging area that services the processing chamber (or chambers, in the case of a cluster tool), delivering unprocessed substrates to the processing chamber and retrieving processed substrates from the processing chamber. If the size of the processing chamber is decreased, then the staging area may be made smaller as well. In a typical reactor system, the largest vacuum area in the system is the staging area because the associated robotics take up more space the further they have to move into the process chamber. Thus, if the process chamber is made smaller, the transport robot can move a shorter distance to access the center of the chamber, the transport arm can be shorter, and the transport chamber can be made smaller as well.

The structure and operation of the reactor 300 for anisotropic etching will now be described in detail with reference to FIG. 3. In an exemplary embodiment, a semiconductor substrate 324, such as a twelve inch or larger wafer, is placed in a processing chamber 310 for etching. The conically-shaped plasma source chamber section 312 is positioned above section 314 of processing chamber 310.

The processing chamber wall 330 is grounded. The processing chamber wall 330 provides a common ground for the system and comprises a conductive material such as aluminum or the like, although there may be an insulating surface deposited or created on the inner walls of this chamber. Within the processing chamber is a substrate support 326 that also acts as an electrode for accelerating ions toward the substrate support. Substrate support 326 may also be made in part from aluminum. The substrate support is supported by a ceramic support 332. Below ceramic support 332 is a gas exhaust 322. Gas may be exhausted from the reactor through outlet 322 using a conventional fan, pump or similar device. The gas exhaust 322 may be coupled to a throttle valve 354 for regulating the gas flow to the exhaust system. An isolation valve 340 may also be provided.

In an exemplary embodiment, a gas supply system (not shown) provides gas(es) such as oxygen, $SF_6$, $CHFCl_2$, argon or the like to the plasma generation chamber through gas inlet 320. The gas supply system and the gas exhaust system cooperate to maintain a gas flow and pressure in the generation chambers that promotes ionization given the strength of the induction electric field. For an $SF_6$/Ar gas based process (a gas mixture which is suitable, for example, for a silicon etch), pressures in the range of 5–20 millitorr are used, with 7–10 millitorr being preferred. In an exemplary embodiment, oxygen gas is provided to the generation chamber at between approximately 10 to 300 standard cubic centimeters per minute, with 50 to 100 standard cubic centimeters per minute being typical. In addition, about 100 to 200 standard cubic centimeters of argon are provided to processing chamber 310. The pressure in processing chamber 310 is maintained at less than about 30 millitorr with a pressure in the range of about 7–10 millitorr being typical. It is believed, however, that total flow rates from 50 standard cubic centimeters per minute up to 300 standard cubic centimeters per minute may be used effectively in this embodiment.

The induction coil 316 is connected to a first power source 318 through a conventional impedance match network (not shown). In the present embodiment, the induction coil has three turns 316a–c spiraling in a conical shape around plasma generation chamber 310, although any number of turns from two to ten or more may be used depending upon the frequency of power to be coupled into the reactor, and the reactor size. The induction coil 316 may have a conductor diameter of approximately ¼ inch, and each turn may be separated from an adjacent turn by a distance of about ⅝ to ⅞ of an inch from center to center. The pitch of the coil is determined by the number of turns of the coil along a given length of the plasma generation chamber 310. In the first embodiment, with three turns each separated by about ⅝ of an inch from an adjacent coil, the pitch is approximately two turns per inch. The pitch of the coil may be varied in different reactors to alter the power density coupled into the reactor. The pitch of the coils may range, for example, from ⅓ to 4 turns per inch and may vary along the plasma generation chamber to alter the level of power coupled into the plasma at a particular point. It is also possible to vary the power level along plasma generation chamber 310 by using multiple coils coupled to different power sources each surrounding a different portion of the conically-shaped plasma generation chamber. Preferably, the coil configuration has a pitch, diameter and power level that provides a highly uniform ion current density across the wafer surface. In an exemplary embodiment, it is preferable for the coil to be shifted in position such that none of the turns of the coil are adjacent to the plasma shaping member.

In an exemplary embodiment, the first power source 318 provides RF power to induction coil 316 at a frequency of approximately 13.56 MHz although it is believed that frequencies from 2 kHz to 40.68 MHz can be used effectively in reactor 300. The power level is typically selected to provide a power density throughout the plasma in the range of from about 0.1 to 3 watts/$cm^3$ with a power density of about several tenths watt/$cm^3$ being preferred. An RF bias in the same frequency ranges may also be applied to substrate support 326 to accelerate ions anisotropically toward the substrate surface. Typically, a low power level of about 30 to 1000 watts is applied to support 326. Power levels at the lower end may be employed to limit the ion bombardment energy and avoid damage to sensitive integrated circuit layers.

In some embodiments, particularly when a high frequency power source is applied to induction coil 316, the induction coil may capacitively couple power into the plasma and modulate the plasma potential relative to the wafer surface. At power levels used to produce a dense plasma, the plasma modulation may cause (uncontrolled) higher energy ion bombardment and degrade the process or damage some exposed layers on substrate 324. A split Faraday shield (not shown) may be interposed between the induction coil 316 and the plasma of reactor 300 to reduce capacitive coupling between coil 316 and the plasma. In this exemplary reactor 300, the bottom of the split Faraday shield may be connected to the top of the processing chamber wall in multiple locations to provide a common RF ground for all of the sections of the split Faraday shield. The split Faraday shield has vertical slots that allow the magnetic field from the induction coil to penetrate into plasma generation chamber 310. The slots prevent a circumferential current from forming in the shield which would oppose this magnetic field. The magnetic field therefore penetrates the shield inducing an electric field as it changes in time. This induction electric field accelerates electrons circumferentially in chamber 310 to produce a plasma. However, the shield substantially reduces capacitive coupling from the induction coil which otherwise accelerate charged particles radially toward substrate 324 and the chamber walls.

In some processes, charge buildup on wafer surfaces can deflect low energy ions and interfere with a low energy anisotropic etch. For such processes, problems associated with charge buildup can be avoided by using high and low power cycles on the induction coil 316 and the wafer support 326. In an exemplary configuration, the first power source 318 applies RF power to the induction coil 316 during high power cycles and applies no power during low power cycles. RF power at 13.56 MHz is typically used, although other frequencies may be used as well. The high power cycles typically last anywhere from 5 to 500 microseconds and the low power cycles typically last from 30 to 1000 microseconds. The duration of the high power cycles is preferably less than or equal to the duration of the low power cycles. The duty cycle of the high power cycles is typically greater than or equal to 10%. The above configuration is exemplary. Generally, what is desired is a high power cycle that sustains a plasma discharge with sufficient ion density for the desired etch rate, and a low power cycle that allows electrons to cool without reducing the ion density below the level required for etching and without making it difficult to sustain the plasma discharge with the next high power cycle.

In the exemplary configuration, the second power source 328 may apply a strong negative voltage pulse(s) to substrate support 326 during low power cycles and may apply little or no voltage during high power cycles. During the low power cycles, the second power source may apply a negative bias of from 20 to 500 volts on the substrate support. A single or multiple square, triangular or sinusoidal pulse(s) may be used to provide the bias during each cycle. The duration and frequency of the pulses are typically selected such that several pulses occur during the average transit time for an ion to cross the plasma sheath and reach the substrate surface. These pulses may cause substrate 324 to be etched by ions which are mainly "coasting" to the surface. The duration of the pulses typically range from 1% to 10% of the average ion transit time with typical values in the range of from about 0.02 to 0.2 microseconds. The above configuration is exemplary. Generally, what is desired is an intermittent bias on substrate 324 that alternates between ion acceleration cycles that accelerate ions toward the substrate for anisotropic etching and charge neutralization cycles that neutralize or remove charges that have accumulated on the substrate surface.

In an alternative embodiment, a lower frequency AC bias (100 kHz to 1 MHz) is applied to substrate 324. The bias may be a continuous AC wave or it may alternate between high power cycles (for multiple wavelengths) and low (or zero) power cycles. Preferably, the half cycles of the AC waveform are at least equal to the ion transit time for ions in the sheath region. When a low frequency AC bias is used, negative and positive ions are alternatively accelerated toward substrate 324 for etching. Since the etch alternates between negative and positive ions, charge buildup on the substrate surface is avoided. The techniques described therein may be combined with plasma shaping member 345 and induction coil 316 according to aspects of the present invention to reduce charge buildup while providing more uniform plasma etching across a large diameter wafer surface.

At a general level, the structure of a reactor for dissociation according to an exemplary embodiment is similar to the reactor for anisotropic etching according to the first embodiment as described above. Induction coils surround a plasma generation chamber 310 containing a plasma shaping member 345 and inductively couple energy into the chamber to produce a plasma. Electrons are accelerated circumferentially within the plasma by the induction electric field causing collisions with molecules. These collisions result in excited molecules, dissociated atoms, and ions. Higher energy collisions tend to produce ionization, while lower energy collisions result in excitation and dissociation. In particular, electron energies in the range of 11–12 eV are typical of the threshold for ionization of oxygen gas, while electron energies of 5–6 eV are typical of the threshold for dissociation.

The electron energies depend upon the strength of the electric field which accelerates the electrons and the density of the gas which determines the mean distance over which electrons are accelerated between collisions. For an anisotropic ion etch reactor, a higher power is applied to the induction coil to increase the induction electric field, and a lower gas pressure is used which allows electrons to accelerate with fewer collisions and attain the energies necessary for ionization. For a plasma reactor used for dissociation, a lower power and higher pressure and flow may be used.

In the first embodiment, a low pressure is used (1–30 millitorr) with a relatively high level of RF power applied to the induction coil (up to 10 kW). This provides a relatively high level of ionization. For the second embodiment, a higher pressure (approximately 1–2 Torr) and lower level of RF power (approximately 500–2000 watts) are used. This favors dissociation over ionization relative to the first embodiment. Preferably, in the second embodiment, only enough ionization occurs to sustain the plasma and continue the dissociation of atoms.

Figure 10:
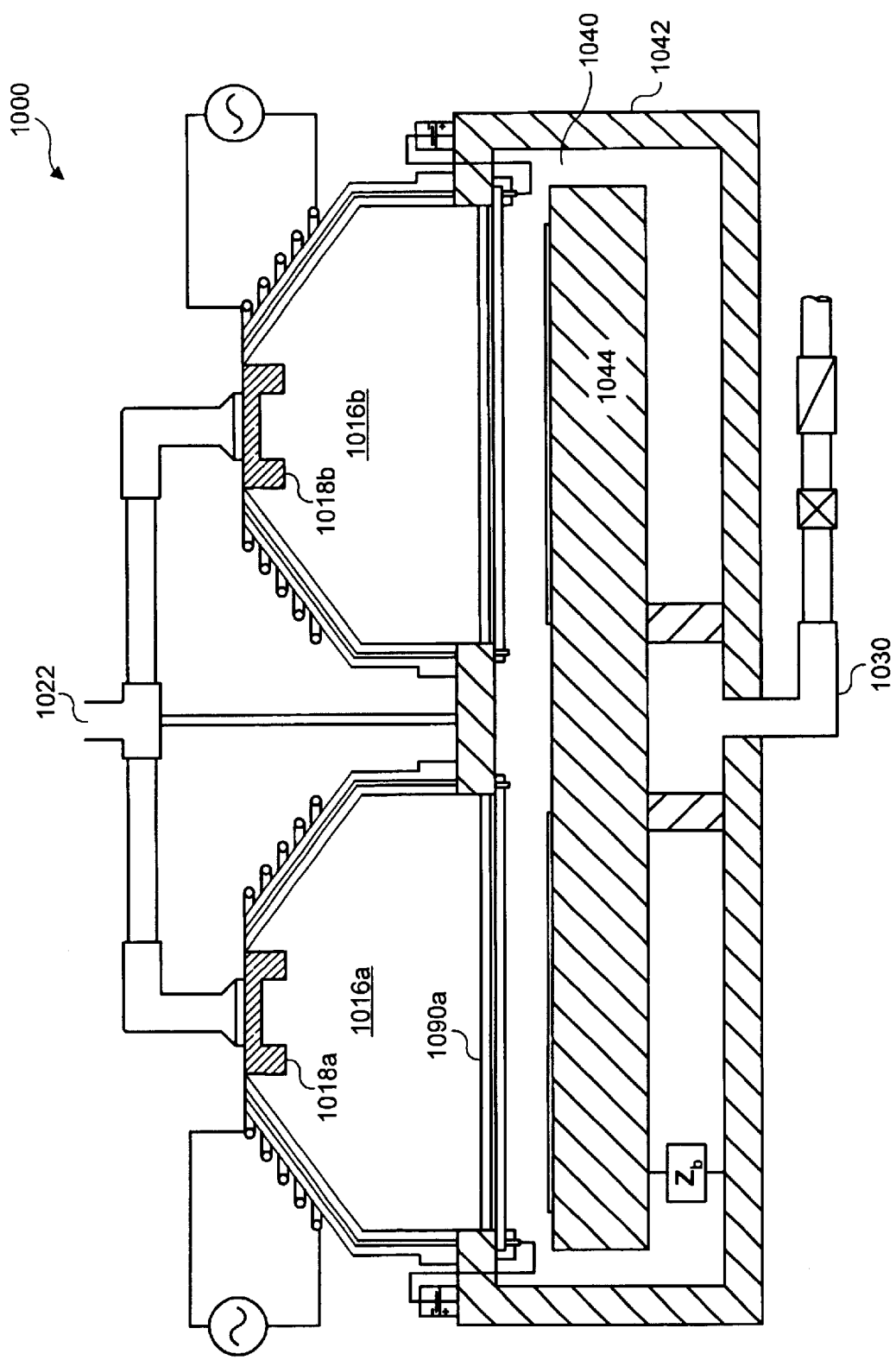
FIG. 10 illustrates an exemplary reactor system capable of processing two substrates side by side.

FIG. 10 illustrates (not to scale) a side cross section of an inductively coupled plasma reactor according to an exemplary embodiment of the present invention directed toward ion sensitive processes such as photoresist strip. The reactor system, generally indicated at 1000, uses two plasma generation chambers 1016a and 1016b with plasma shaping members 1018a and 1018b side by side. Similar components may be used in each of the plasma generation chambers 1016a and 1016b. These components are identified using the same reference numeral for each chamber, except that suffixes "a" and "b" have been added to differentiate between components for generation chamber 1016a and 1016b, respectively. The elements of this embodiment may also be referred to generally by their reference numeral without any appended suffix. As shown in FIG. 10, the two generation chambers use substantially duplicate elements and operate substantially independently. They may, however, share a gas supply system 1022, an exhaust system 1030, and a substrate processing chamber 1040 having chambers walls 1042. The exemplary reactor 1000 allows concurrent processing of two substrates 1050 (supported by a single substrate support 1044) which doubles throughput. In particular, the reactor 1000 may be configured for use in conjunction with the Aspen™ wafer handling system from Mattson Technology, Inc. Of course, it will be readily apparent that aspects of the present invention may be used in any variety of plasma processing systems including systems with single or multiple plasma generation chambers. It will also be readily apparent that an anisotropic etch reactor similar to that of the first embodiment may also be fabricated using multiple plasma generation chambers. The reactor may include a charged particle filter 1090 for separating ions and neutral particles, such that the substrate may be processed with substantially only neutral particles.

The significance of a parameter found by taking the ratio of the internal area of the processing chamber, in a plane parallel to the substrate, to the area of the substrate itself ($A_{chamber}/A_{substrate}$) has been discussed above for single substrate reaction chambers. As described above, it is believed that plasma uniformities below about ±15% may be attained in embodiments of the present invention without having to resort to a larger chamber for a given size substrate. These plasma uniformities may be below about ±5%. The same principles apply to a reactor capable of processing substrates side by side. Conventional reactors allocate a distance of about 3 to 4 inches between the edge of a substrate and an adjacent sidewall of the chamber. This means that for a reactor processing two 8 inch substrates side by side, with a partition between them, the center-to-center spacing of the wafers will be about 16 inches. According to embodiments of the present invention, this center-to-center spacing is about 11 inches, and only about 1.5 inches is needed between the edge of the substrate and the sidewall of the chamber. Conventional reactors need 20 to 24 inches center-to-center for processing two 12 inch wafers side by side, again, with a partition between the wafers and as much as a 4 inch clearance between the edge of the substrate and the sidewall of the reactor. Embodiments of the present invention provide for a more compact reactor with a 16 inch center-to-center spacing of 12 inch wafers and 1.5 inch clearance.

Referring to FIG. 10, reactor 1000 has plasma generation chambers 1016 with plasma shaping members 1018 for producing a plasma. The conically-shaped sections have nonconductive chamber walls 1012 and are surrounded by helical induction coils 1070 which substantially conform to the conical shape of the chamber walls. The induction coils 1070 are coupled to first sources of radio frequency power 1080 to inductively couple power into the plasma generation chambers 1016. The plasma generation chambers 1016 and the induction coils 1070 allow neutral activated species to be produced as gas flows along the conical section. This promotes the uniform diffusion of activated neutral species across the wafer surface. Gas is provided to the plasma generation chambers 1016 through gas inlets 1024 and is exhausted from the reactor through gas exhaust 1030.

As discussed above, many advantages may be realized with an inductively-coupled plasma reactor with a plasma shaping member in accordance with the principles of the present invention. In ion enhanced processes, for example, a plasma generation chamber with a plasma shaping member may be configured to provide a substantially flat stagnation surface and uniform plasma potential across the wafer surface. In non-ion enhanced processes, varying levels of power can be applied. As a result, highly uniform ion bombardment can be produced across a large diameter substrate surface.

Figure 11:
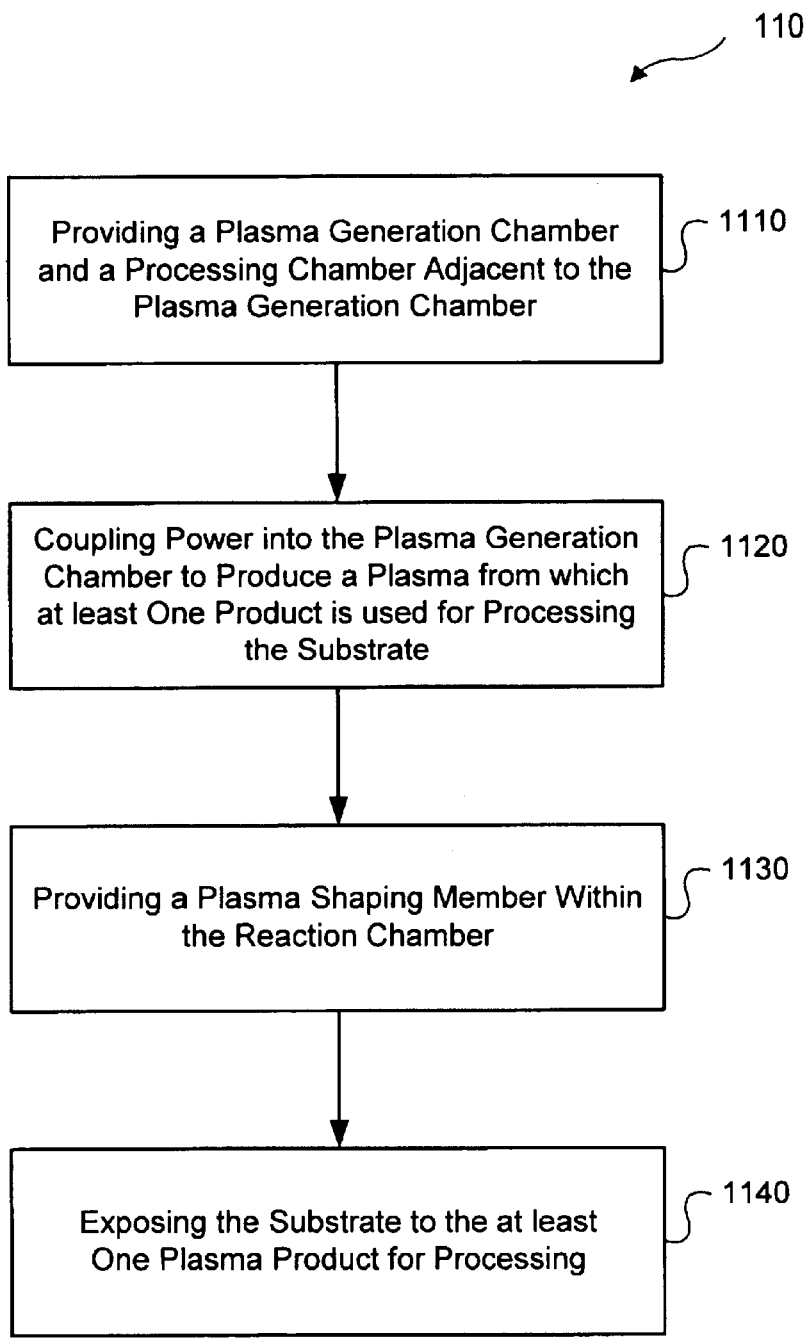
FIG. 11 illustrates an exemplary method in which principles of the present invention may be advantageously practiced.

Referring to FIG. 11, an exemplary method by which the principles of the present invention may be advantageously practiced is depicted generally at 1100. The exemplary method of FIG. 11 utilizes the plasma generation chamber and plasma shaping member in accordance with the principles described above. At step 1110, a plasma generation chamber and a processing chamber adjacent to the plasma generation chamber are provided. At step 1120, power is coupled into the plasma generation chamber to produce a plasma from which at least one product is used for processing the substrate. At step 1130, a plasma shaping member within the reaction chamber is provided, and at step 1140, the substrate is exposed to the at least at least one plasma product for processing.

While the present invention has been described with reference to exemplary embodiments, it will be readily apparent to those skilled in the art that the invention is not limited to the disclosed embodiments but, on the contrary, is intended to cover numerous other modifications and broad equivalent arrangements that are included within the spirit and scope of the following claims.

What is claimed is:

1. A plasma reactor system for processing a substrate, the plasma reactor comprising:

a processing chamber for containing a plasma, the plasma comprising at least one plasma product for processing the substrate;

a gas inlet coupled to the processing chamber for providing gas to the processing chamber;

a first power source;

an induction coil outside of the processing chamber, coupled to the first power source, to couple power from the first power source into the processing chamber to sustain the plasma;

a plasma shaping member positioned within the processing chamber, the plasma shaping member having a recessed portion substantially above the center of the substrate and an extended portion outside the recessed portion, wherein the electrical potential of the plasma shaping member is floating relative to ground during processing of the substrate; and a support for the substrate positioned such that the substrate is exposed to the at least one plasma product during processing.

2. The reactor system of claim 1, wherein the material comprising the plasma shaping member is selected from the group consisting of quartz, silicon carbide, ceramic, and metal.

3. The reactor system of claim 1, wherein the plasma shaping member is configured such that the recessed portion and the extended portion face the substrate.

4. The reactor system of claim 1, wherein the outside diameter of the plasma shaping member ranges from 60 to 90 percent of the diameter of the substrate.

5. The reactor system of claim 1, wherein the extended portion has a width Z that is greater than 10 percent of the outside dimension of the plasma shaping member, and less than 30 percent of the outside dimension of the plasma shaping member.

6. The reactor system of claim 1, wherein the recessed portion has a thickness X that is between 0.3 and 0.5 inches and the extended portion has a height Y that is between 0.3 and 0.5 inches.

7. The reactor system of claim 1, wherein the recessed portion has a thickness X and the extended portion has a height Y such that the sum of X and Y is at least 10 percent of the height of the processing chamber.

8. The reactor system of claim 1, wherein the plasma has a density that is more uniformity across the surface of the substrate than a density that would result from a plasma formed in the processing chamber in the absence of the plasma shaping member.

9. The reactor system of claim 1 further comprising a top wall of the processing chamber, and wherein the plasma shaping member is positioned adjacent to the top wall of the processing chamber.

10. The reactor system of claim 1, further comprising a split Faraday shield.

11. The reactor system of claim 1, further comprising a charged particle filter.

12. The reactor system of claim 1, wherein the plasma shaping member is configured such that high temperature electrons are produced adjacent to the induction coil and are substantially blocked from diffusing toward the center of the processing chamber.

13. The reactor system of claim 1, wherein the plasma shaping member provides a surface on which positive ions from the plasma and negatively charged species from the plasma recombine.

14. The reactor system of claim 1, wherein the plasma shaping member is configured to provide a plasma with an ion flux at the center of the substrate that is within ±15 percent of an ion flux at the edge of the substrate.

15. The reactor system of claim 1, wherein the plasma shaping member is configured to provide a plasma with a maximum potential surface over the substrate that is substantially flat.

16. A plasma reactor system for processing a substrate according to claim 1, wherein the plasma chamber has a conical section and at least part of the induction coil is positioned adjacent to the conical section.

17. A plasma reactor system for processing a substrate according to claim 1, wherein the plasma shaping member comprises an insulating material.

18. A plasma reactor system for processing a substrate according to claim 1, wherein the plasma chamber has a conical section and the induction coil is positioned adjacent to the conical section and substantially con forms to the shape of the conical section, and a plasma containing region of the plasma chamber is defined between the extended portion of the plasma shaping member and at least a portion of the induction coil such that the extended portion of the plasma shaping member acts as an obstacle to diffusion of high temperature electrons from the plasma containing region into the recessed portion of the plasma shaping member.

19. A plasma reactor system for processing a substrate according to claim 18, wherein the plasma shaping member comprises an insulating material.

20. A plasma reactor system for processing a substrate, the plasma reactor comprising:

a processing chamber for containing a plasma, the plasma comprising at least one plasma product for processing the substrate;

a gas inlet coupled to the processing chamber for providing gas to the processing chamber;

a first power source;

an induction coil, coupled to the first power source, to couple power from the first power source into the processing chamber to sustain the plasma;

a plasma shaping member having a recessed portion substantially above the center of the substrate and an extended portion outside the recessed portion;

wherein the electrical potential of the plasma shaping member is floating relative to ground during processing of the substrate;

a plasma containing region of the plasma chamber defined between the extended portion of the plasma shaping member and at least a portion of the induction coil such that the extended portion of the plasma shaping member acts as an obstacle to diffusion of high temperature electrons from the plasma containing region into the recessed portion of the plasma shaping member; and a support for the substrate positioned such that the substrate is exposed to the at least one plasma product during processing.

21. A plasma reactor system for processing a substrate of 20, wherein the plasma chamber has a conical section and at least part of the induction coil is positioned adjacent to the conical section.

22. A plasma reactor system for processing a substrate according to claim 20, wherein the plasma shaping member comprises an insulating material.

* * * * *